US007002628B1

(12) United States Patent
Panicacci

(10) Patent No.: US 7,002,628 B1
(45) Date of Patent: Feb. 21, 2006

(54) ANALOG TO DIGITAL CONVERTER WITH INTERNAL DATA STORAGE

(75) Inventor: Roger Panicacci, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/281,358

(22) Filed: Mar. 30, 1999

Related U.S. Application Data

(60) Provisional application No. 60/080,062, filed on Mar. 31, 1998.

(51) Int. Cl.
*H04N 5/335* (2006.01)
*H04N 5/228* (2006.01)
*H03M 1/12* (2006.01)

(52) U.S. Cl. .................. 348/307; 348/308; 348/222.1; 341/155

(58) Field of Classification Search ........ 348/294–324, 348/222.1, 241; 378/58.8, 98.8; 341/126, 341/155, 141; 250/208.1; 257/291–293
See application file for complete search history.

(56) References Cited

U.S. PATENT DOCUMENTS

| 4,739,323 | A | * | 4/1988 | Miesterfeld et al. | 370/447 |
|---|---|---|---|---|---|
| 4,839,729 | A | * | 6/1989 | Ando et al. | 348/241 |
| 5,841,126 | A | * | 11/1998 | Fossum et al. | 348/308 |
| 5,877,719 | A | * | 3/1999 | Matsui et al. | 341/155 |
| 5,880,691 | A | * | 3/1999 | Fossum et al. | 341/162 |
| 5,982,318 | A | * | 11/1999 | Yiannoulos | 341/155 |
| 6,037,891 | A | * | 3/2000 | Griph | 341/161 |
| 6,115,066 | A | * | 9/2000 | Gowda et al. | 348/308 |
| 6,166,367 | A | * | 12/2000 | Cho | 348/294 |
| 6,295,546 | B1 | * | 9/2001 | Adiletta | 348/294 |

FOREIGN PATENT DOCUMENTS

JP        06-260938      *  9/1994

* cited by examiner

*Primary Examiner*—James J. Groody
*Assistant Examiner*—Nhan Tran
(74) *Attorney, Agent, or Firm*—Dickstein Shapiro Morin & Oshinsky LLP

(57) ABSTRACT

An analog-to-digital converter in an active pixel sensor array includes on board memory elements for storing results. The stored results can be read out in a different order than the order in which they were converted.

7 Claims, 20 Drawing Sheets

| FIG. 4A | FIG. 4B |

| FIG. 4A | FIG. 4B |

| FIG. 14A | FIG. 14B |

| FIG. 14A | FIG. 14B |

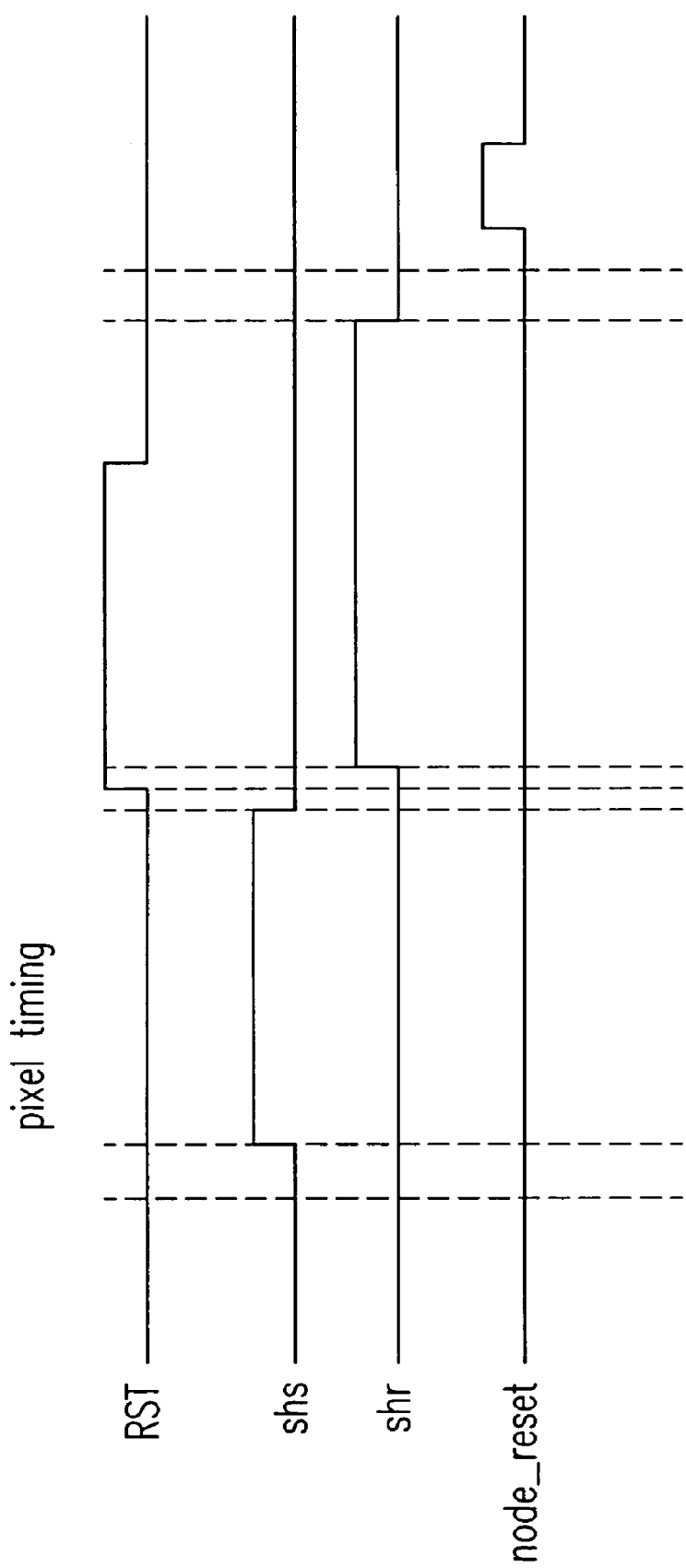

ANALOG TO DIGITAL CONVERTER WITH INTERNAL DATA STORAGE

CROSS REFERENCE TO RELATED APPLICATIONS

This application claims benefit of U.S. Provisional Application No. 60/080,062, filed on Mar. 31, 1998 which is incorporated herein by this reference.

BACKGROUND

Active pixel sensors are well known in the art. A typical active pixel sensor is described in U.S. Pat. No. 5,471,515.

One popular architecture for an active pixel sensor uses column-parallel A to D converters. Each A to D converter is associated with one or multiple columns. It may be desireable to associate the A to D converter with multiple columns to allow a wider pitch for its physical layout. This possibly allows more options in layout.

SUMMARY

The present system teaches a special way of handling A to D converters which are arranged as column parallel for multiple-column. The present system describes an A to D converter which has an internal data storage unit, which stores units of the information.

BRIEF DESCRIPTION OF THE DRAWINGS

FIGS. 15 and 16 are timing diagrams associated with the circuit of FIG. 14.

DESCRIPTION OF THE PREFERRED EMBODIMENTS

Figure 1:
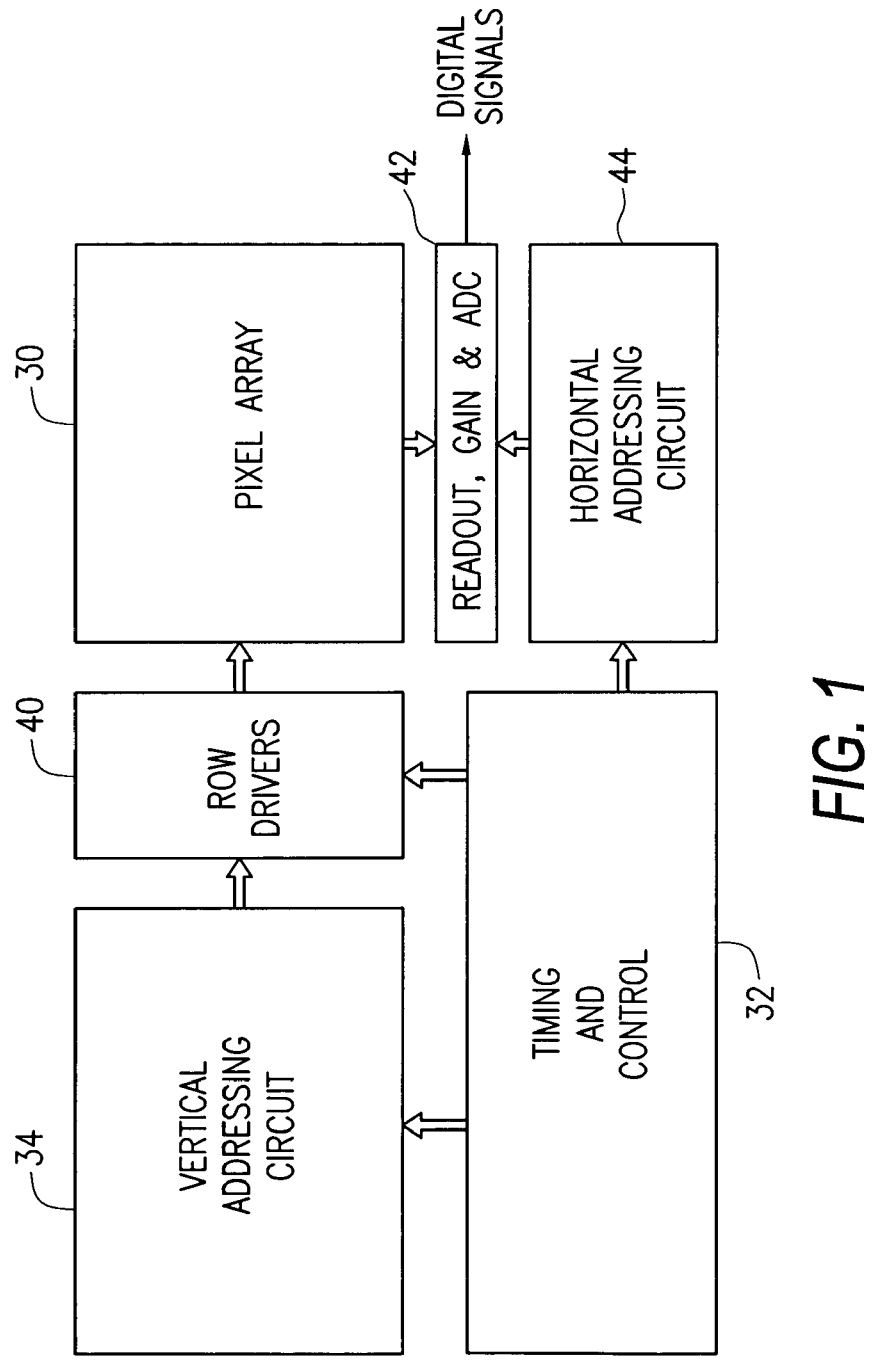
FIG. 1 is a block diagram of an exemplary CMOS active pixel sensor chip.

FIG. 1 shows an exemplary CMOS active pixel sensor integrated circuit chip that includes an array of active pixel sensors 30 and a controller 32 which provides timing and control signals to enable reading out of signals stored in the pixels. Exemplary arrays have dimensions of 128 by 128 pixels or 256 by 256 pixels, although, in general, the size of the array 30 will depend on the particular implementation. The imager is read out a row at a time using a parallel column readout architecture. The controller 32 selects a particular row of pixels in the array 30 by controlling the operation of a vertical addressing circuit 34 and row drivers 40. Signals stored in the selected row of pixels are read out to circuitry 42 for amplifying the pixel signals and for converting the analog signals to corresponding digital signals. Signals for selecting the digital signals corresponding to a particular column in the array are provided from the controller 32 through a horizontal addressing circuit 44.

Figure 2:
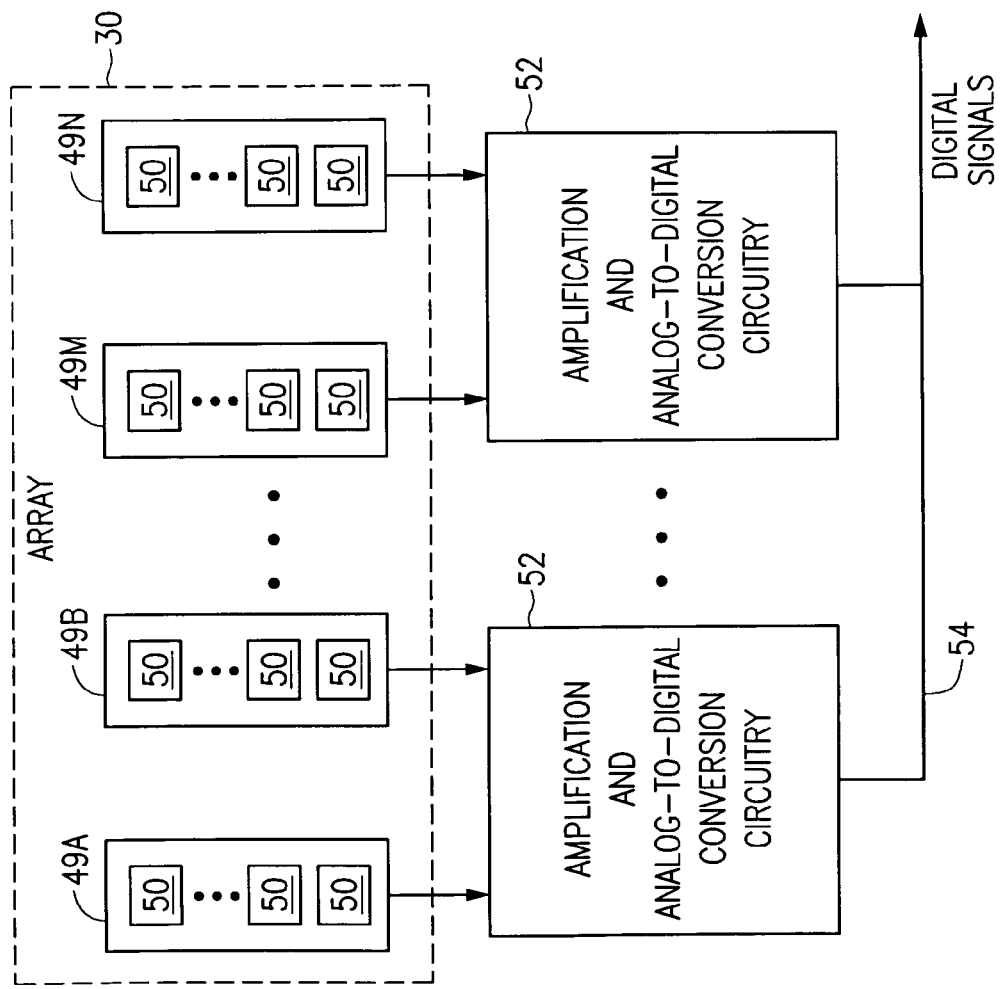
FIG. 2 is a block diagram showing an array of active pixel sensors and a parallel column readout stage for providing amplification and analog-to-digital conversion.
Figure 3:
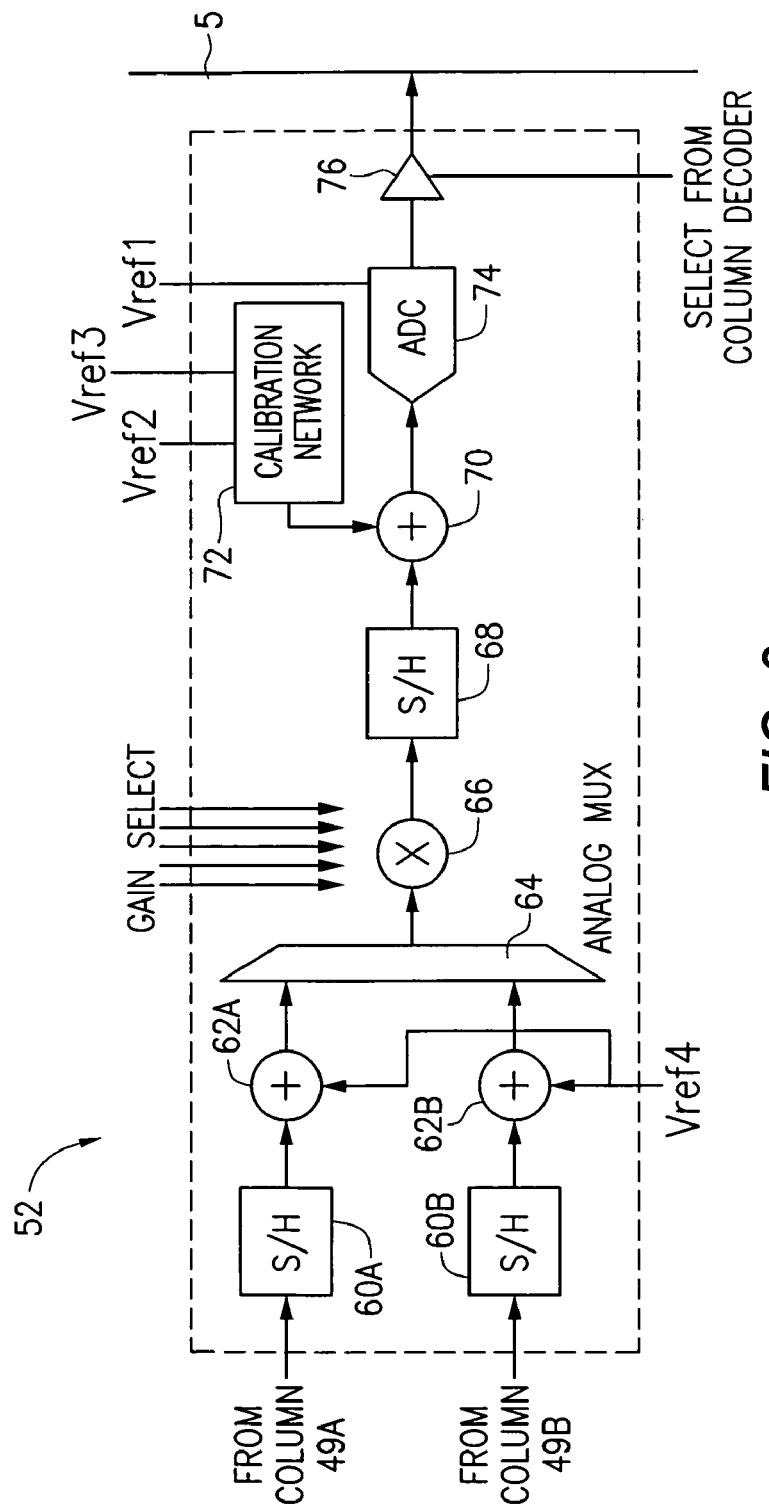
FIG. 3 is a block diagram illustrating further details of a readout circuit with amplification and analog-to-digital conversion.

FIG. 2 shows the array 30 with multiple columns, 49A through 49N, of CMOS active pixel sensors 50. Each column includes multiple rows of sensors 50. Signals from the active pixel sensors 50 can be read out to respective circuits 52 each of which is associated with a different group of one or more columns 49A through 49N, with each column associated with one of the circuits 52. As shown in FIG. 3, each of the circuits 52 can receive and process signals from a pair of columns. For example, one of the circuits 52 receives and processes signals from columns 49A and 49B. In other implementations, each circuit 52 may receive and process signals either from only a single column or from more than two columns of sensors. For example, in some implementations, each circuit 52 would receive and process signals from four columns. Digital signals corresponding to the analog pixel signals then can be read out serially to a bus 54.

As shown in FIG. 3, according to one implementation, each circuit 52 includes circuits 60A, 60B for sampling and holding signals from a corresponding one of the columns of pixels. For example, the circuit 60A can sample and hold signals from the column 49A, and the circuit 60B can sample and hold signals from the column 49B. In particular, pixel signal and reset values can be sampled by each of the sample-and-hold circuits 60A, 60B so as to generate a double sampled differential value. Additional circuitry 62A, 62B allows a pre-gain offset voltage VREF4 to be added or subtracted to a reset signal stored by the sample-and-hold circuits 60A, 60B.

The circuit 52 further includes an analog multiplexer (MUX) which allows the differential value corresponding to a selected one of the pixels to be passed through to a charge transimpedance amplifier (CTIA) 66 which can have a variable gain. The amplified differential signal is stored by another sample-and-hold circuit 68 and is provided to a summing node 70. The summing node 70 also receives signals from a calibration network 72 which uses reference voltages VREF2, VREF3. The output of the summing node 70 is provided to an analog-to-digital converter (ADC) 74 which uses a reference voltage (VREF1). One or more latches 76 store the digital bits and can be enabled to transmit the bits to the bus 54.

Figures 4, 4A:
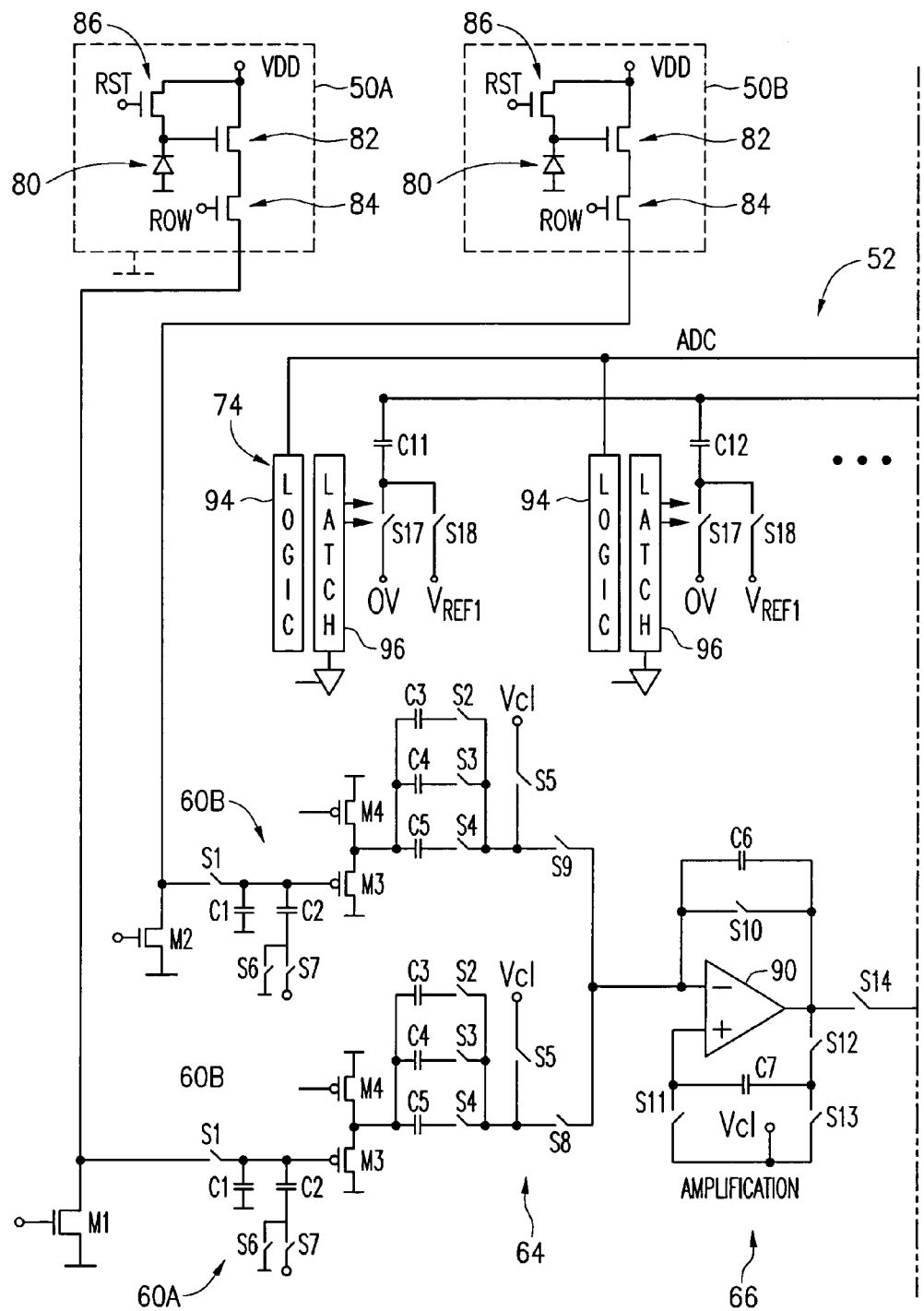
FIG. 4, which comprises FIGS. 4A and 4B, form an illustration of an embodiment of the readout circuit.
Figures 4, 4B:
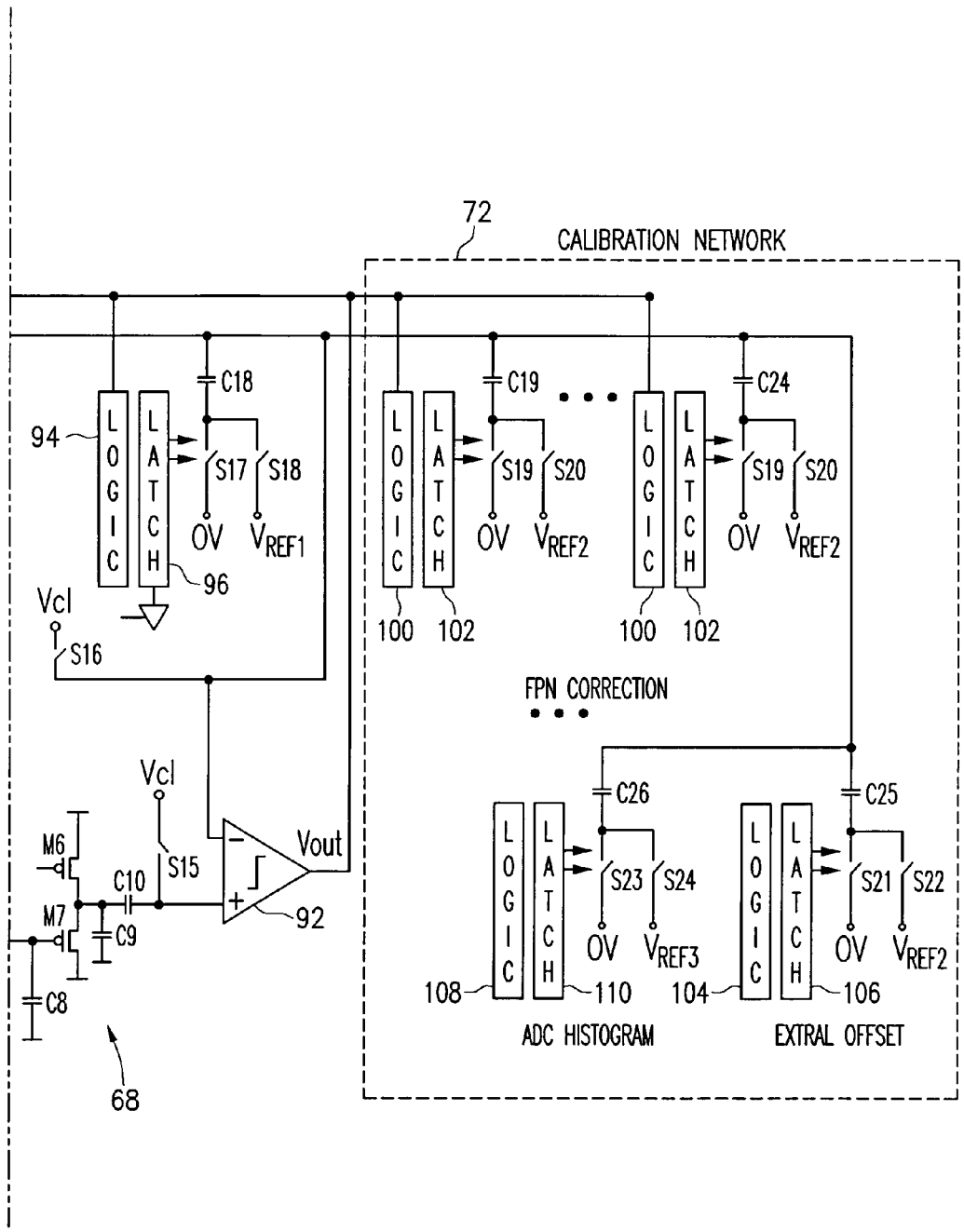

As shown in FIG. 4, CMOS active pixel sensors 50A, 50B are located in respective columns 49A, 49B of the sensor array. Each sensor 50A, 50B can include a photo-sensitive element 80 buffered by a source-follower transistor 82 and a row selection switch which can be implemented by a transistor 84. A signal "ROW" is applied to the gate of the row selection transistor 84 to enable a particular row of pixels. In one implementation, the element 80 includes a photogate with a floating diffusion output separated by a transfer gate. Each pixel 50A, 50B also includes a reset switch which can be implemented as a transistor 86 controlled by a signal "RST" applied to its gate.

As further illustrated in FIG. 4, the readout circuit 52 includes load transistors M1, M2 for the respective source-followers 82. As described in greater detail below, signals from selected pixels can be read into the respective sample-and-hold circuits 60A, 60B. The two sample-and-hold circuits 60A, 60B are substantially the same and, thus, only one of them will be described in detail.

The sample-and-hold circuit 60A includes a sample switch S1 and a charge storage element such as the capacitor C1. The switch S1 can be implemented as a transistor which can be enabled to be in a conductive state or a non-conductive state.

A pre-gain offset voltage can be added to a value stored by the capacitor C1 by controlling the states of switches S6, S7 which connect the lower plate of a capacitor C2 either to ground or to the offset voltage VREF4. The capacitor C2 is connected in parallel with the capacitor C1. The capacitor C2 can be used, for example, to subtract a dark signal level prior to amplifying the pixel signal. That can increase the dynamic range of the sensor 50 by removing a common DC offset from the pixel array 30. Preferably, the ratio of the values of the capacitors C2 and C1 is approximately 1 to 64.

A source-follower transistor M3 with a load transistor M4 is coupled between the hold capacitor C1 and an array of clamping capacitors C3, C4, C5 connected in parallel. In one implementation, the capacitors C3, C4, C5 form a binary-scaled array. Thus, for example, the values of C3, C4 and C5 can be 64, 128 and 256 femto-farads, respectively. Each capacitor in the array has a corresponding switch S2, S3, S4. When a switch, such as the switch S2, is closed, one of its poles is coupled to the right-hand plate of the corresponding capacitor C3. A second pole of each switch S2, S3, S4 can be coupled to a clamping voltage level Vcl by closing a switch S5.

To provide a signal from a selected one of the sample-and-hold circuits 60A, 60B to the amplifier circuit 66, one of two switches S8, S9 is closed. For example, to select the output of the circuit 60A, the switch S8 would be closed. Conversely, to select the output of the circuit 60B, the switch S9 would be closed. Thus, the switches S8, S9 correspond to the multiplexer 64 in FIG. 3. Each of the switches S2 through S9 can be implemented, for example, as transistors which can be switched between a conductive and non-conductive state by applying appropriate voltage signals to their respective gates.

Figure 5:
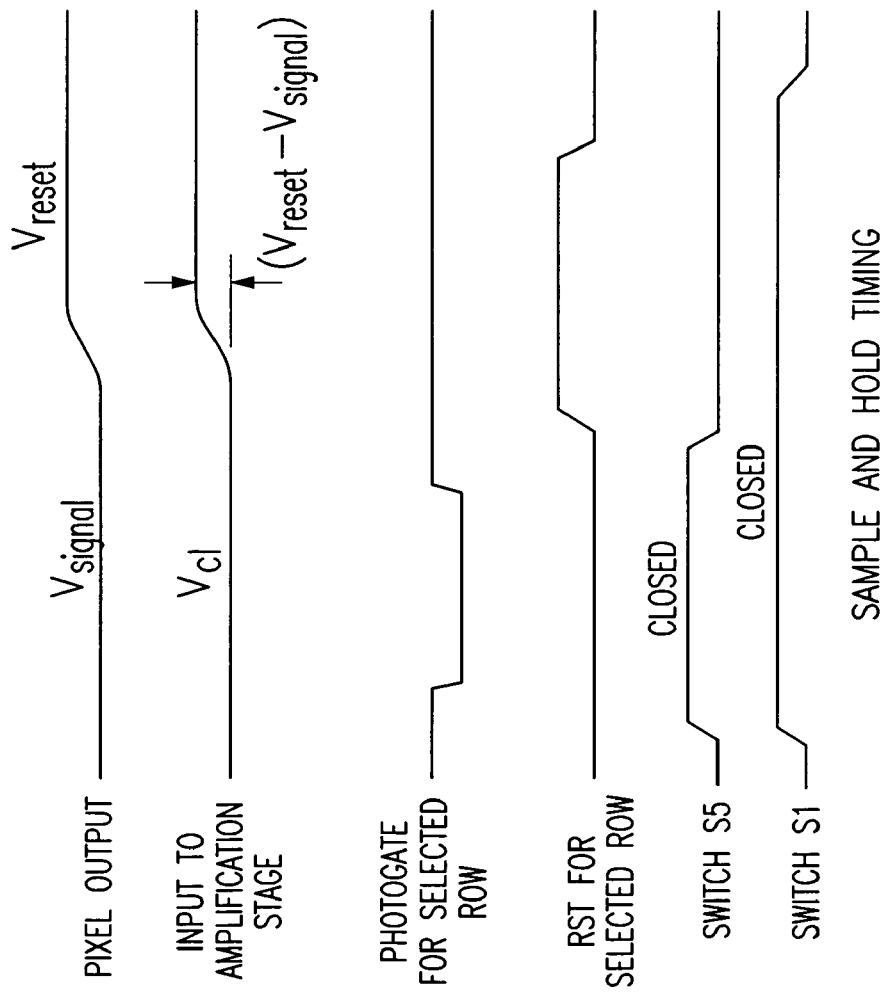
FIG. 5 is a timing diagram for sample and hold steps associated with the circuit of FIG. 4.

The operation of the sample-and-hold circuits 60A, 60B is explained with reference to the timing diagram of FIG. 5. During signal integration in the pixel array 30, the row selection transistors 84 are turned off by setting the row selection signal "ROW" to a low signal such as 0 volts (V). Following signal integration, an entire row of pixels is read out substantially simultaneously with pixels from two columns being sampled by each circuit 52.

Prior to reading out the row of pixels, the switches S2, S3, S4 and S5 are closed. At this time, the switches S8, S9 should be open. Next, the pixels in the row to be read out are addressed by enabling the corresponding row selection transistors 84. Thus, the signal value on the photosensitive element 80 in the pixel 50A is switched through the corresponding source-follower transistor 82 and row selection transistor 84. The sampled pixel value is held by the capacitor C1 in the sample-and-hold circuit 60A. Similarly the left-hand plates of the capacitors C3, C4, C5 are held at the pixel signal value. The right-hand plates of the clamping capacitors C3, C4, C5 are held at the voltage level Vcl. At substantially the same time, the signal value of the pixel SOB appears on the corresponding array of capacitors in the sample-and-hold circuit 60B.

Next, the switch S5 in each sample-and-hold circuit 60A, 60B is opened so that the right-hand plates of the capacitors C3, C4, C5 remain floating at the voltage level Vcl. The photosensitive element 80 in each pixel in the selected row is reset by enabling the corresponding reset transistor 86. The reset level of the pixel then is stored by the corresponding capacitor C1. Similarly, the voltage on the floating side of the clamping capacitors C3, C4, C5 rises above the voltage level Vcl by an amount equal to the difference between the pixel reset level ($V_{reset}$) and the signal level ($V_{signal}$). The sample switch S1 is then opened.

Once the pixel signal and reset values have been sampled, the differential values are amplified, and the amplified values are converted to corresponding digital signals. Since the two sample-and-hold circuits 60A, 60B share a single gain and analog-to-digital conversion circuit, the amplification and conversion steps are performed with respect to the pixel from the even-numbered column (e.g., column 49A) and subsequently performed for the pixel from the old-numbered column (e.g., column 49B). A set of latches 96 associated with the ADC 74 stores the results from the first amplification and conversion steps while the pixel value from the remaining column is being processed. Then, two bytes of information corresponding to the two pixels 50A, 50B are read out from the latches 96 to transfer the bytes to the bus 54, with one byte transferred during each clock cycle.

Figure 6:
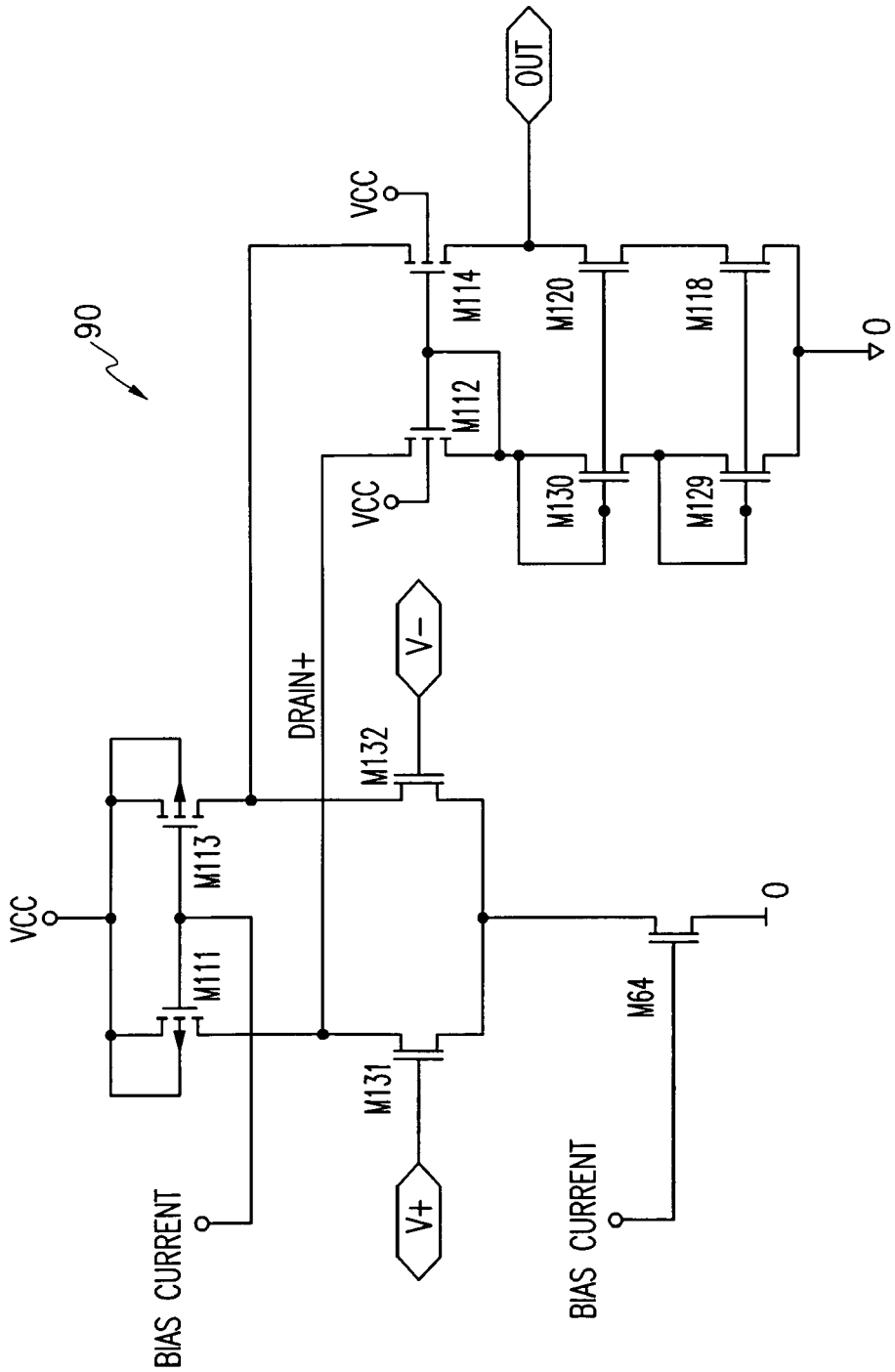
FIG. 6 is a circuit diagram of an exemplary operational amplifier for use in the circuit of FIG. 4.

Returning to FIG. 4, further details of the charge sensing amplifier circuit 66 are now explained. The amplifier circuit 66 includes an operational amplifier 90, a feedback switch S10 and a feedback capacitor C6. Details of an exemplary operational amplifier 90 are illustrated in FIG. 6. The gain (G) of the charge sensing amplifier circuit 66 is determined by the clamping capacitors C3, C4, C5 (FIG. 4) that are selectively coupled to an input of the operational amplifier 90 through the switch S8 (or S9). The gain of the amplifier circuit is, therefore, approximately equal to the ratio of the effective capacitance seen by the negative terminal of the operational amplifier 90 and the value of the feedback capacitor C6. Thus, the gain (G) can be varied by closing a selected one or more of the switches S2, S3, S4 during the amplification step.

The output of the operational amplifier 90 is coupled through a switch S14 to a circuit that includes capacitors C8, C9, C10. A clamping circuit includes a switch S15 that selectively can be closed to hold the right-hand plate of the capacitor C10 at the voltage level Vcl. A source-follower transistor M7 with a load transistor M6 couples the output of the operational amplifier 90 to the capacitors C9, C10.

The amplifier circuit 66 also can include additional circuitry for reducing or eliminating an offset of the operational amplifier 90. The additional circuitry includes the capacitor C7 and switches S11, S12, S13, with common poles of the switches S11 and S13 held at the reference voltage Vcl. Each of the switches S10 through S15 can be implemented, for example, as transistors which can be switched between a conductive and non-conductive state by applying appropriate voltage signals to their respective gates.

Figure 7:
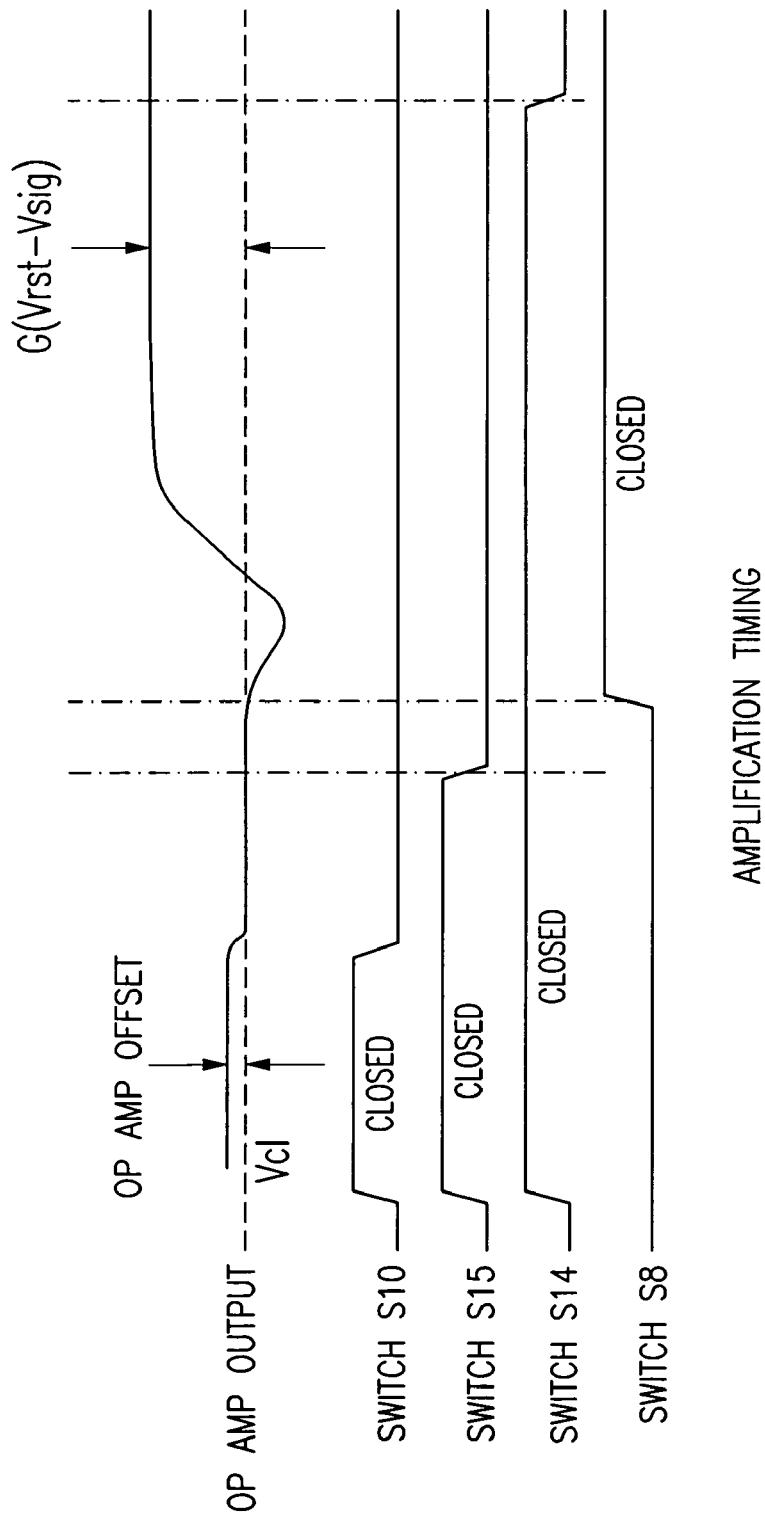
FIG. 7 is a timing diagram for an amplification step associated with the circuit of FIG. 4.

Operation of the amplification stage of the circuit 52 is explained with reference to the timing diagram of FIG. 7.

The operational amplifier 90 is reset by closing the switch S10, at which time the switches S11 and S12 also are closed. The offset of the operational amplifier 90 is stored across the capacitor C7 connected to the positive terminal. At substantially the same time, the clamping circuit is enabled to store the offset level by closing the switches S14 and S15.

Next, the reset switch S10, as well as the switches S11, S12, are opened, and the switch S13 is closed. In addition, the clamping switch S15 is opened. As a result, the offset of the operational amplifier 90 is stored on its positive terminal, and the output of the operational amplifier settles to about the voltage level Vcl. The clamping capacitor C10 stores the reset value of the operational amplifier 90 relative to the voltage level Vcl. While the reset operation is being performed, one or more of the switches S2, S3, S4 are closed to select the variable gain (G) of the amplifier circuit. In some applications, the same gain is used for all the pixels. In other applications, however, the sensor array is configured to capture color images by covering different pixels with different spectrum-discriminating filters. Each pixel responds to a different primary color, such as red, green or blue. Different gains may be applied to signals from pixels associated with different colors which can be desirable, for example, to increase the perceived luminance of the captured image.

Once the reset operation for the operational amplifier 90 has been completed, the switch S8 (or S9) is closed to enable the charge stored on the clamping capacitors C3, C4 and/or C5 to be transferred to the feedback capacitor C6. The signal appearing at the output of the operational amplifier 90 is proportional to the gain (G) times the difference between the pixel reset and signal levels (Vreset-Vsignal). When the switch S14 at the output of the operational amplifier 90 is opened, the voltage at the left-hand plate of the clamping capacitor C10 is the amplified differential signal relative to the voltage level Vcl.

Figure 8:
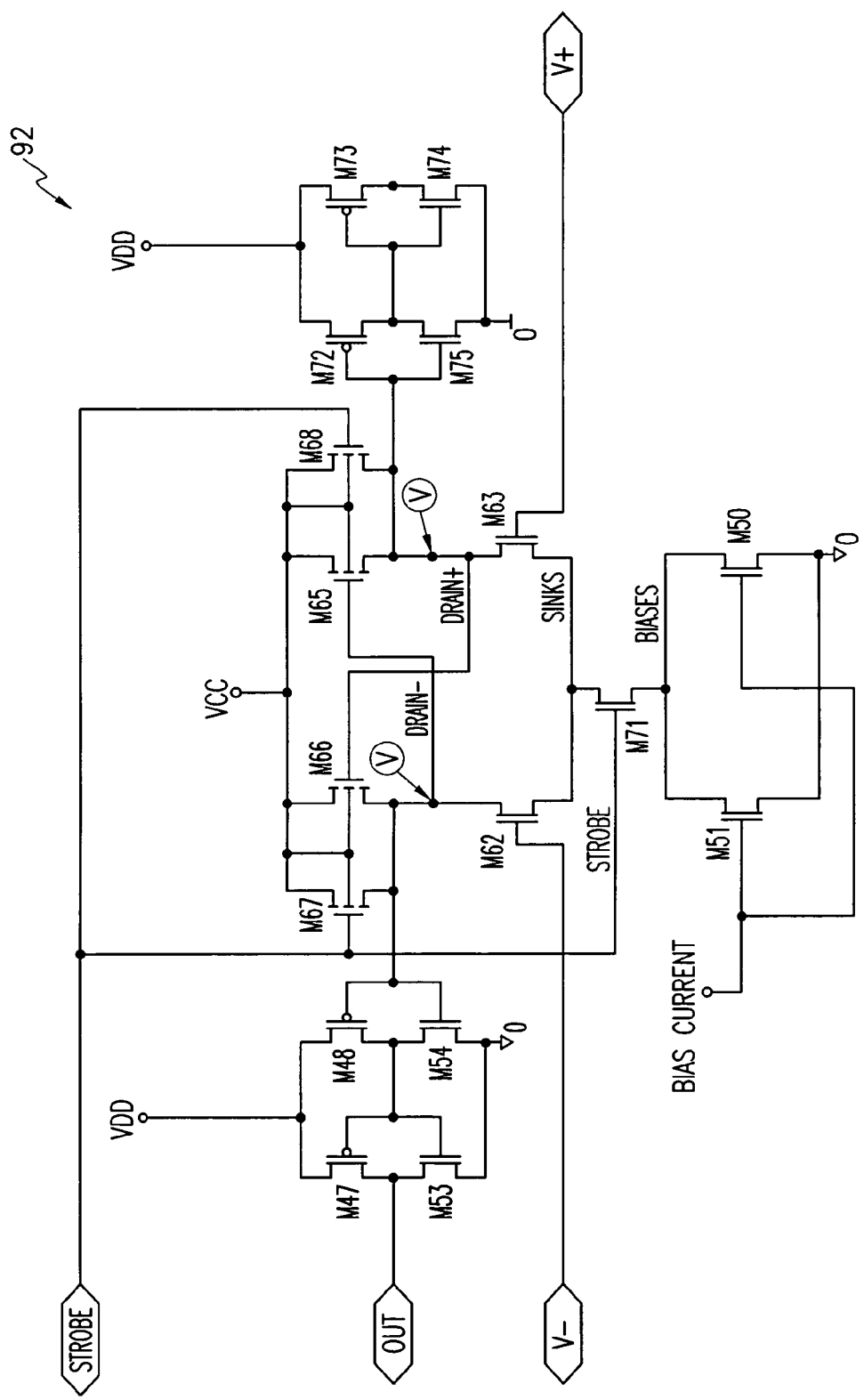
FIG. 8 is a circuit diagram of an exemplary comparator for use in the circuit of FIG. 4.

The amplified differential analog signal then is converted to a corresponding digital signal by the ADC 74. In the implementation of FIG. 4, the ADC 74 includes a comparator 92 and a binary-scaled network of capacitors C11, C12, C18. Details of an exemplary comparator circuit 92 are illustrated in FIG. 8. The comparator 92 includes positive and negative terminals and an output. A "strobe" signal enables the comparator 92 to provide an output signal based on the signals at its positive and negative terminals.

The binary-scaled capacitor network is used to approximate the amplified differential pixel signal using a successive approximation technique. The capacitor C11 corresponds to the most significant bit (MSB) in the digital signal, whereas the capacitor C18 corresponds to the least significant bit (LSB). The relationship between the values of the capacitors for adjacent bits is such that the capacitance corresponding to the more significant bit is twice the capacitance of the less significant bit. Thus, if the capacitor C11 has a capacitance of C, the capacitor C12 would have a capacitance of C/2. In one implementation, the capacitor network includes eight capacitors so that the analog differential signal can be converted to an 8-bit digital signal. The capacitor C18 would then have a capacitance of $C/2^7$.

Figure 10:
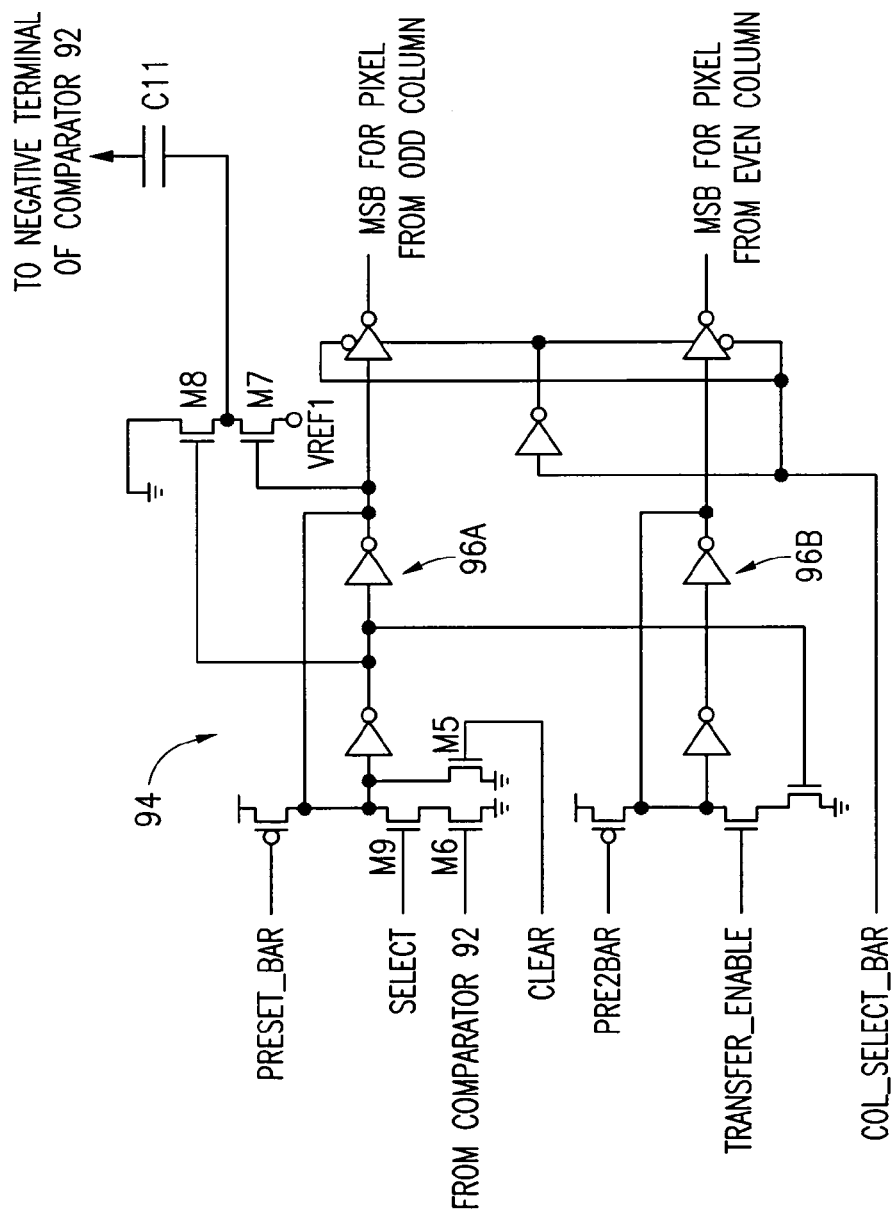
FIG. 10 is an exemplary logic circuit associated with the analog-to-digital conversion.

The bottom plate of each capacitor C1, C12, C18 can be connected to either zero volts or a reference voltage VREF1 by using respective switches S17, S18 associated with the particular capacitor. The reference voltage VREF1 defines the dynamic range of the ADC 74. Each of the capacitors C11, C12, C18 in the network has associated logic 94 and a latch 96 for storing one of the eight bits corresponding to the digital value for the pixel. Details of an exemplary circuit for the logic 94 and latch 96 are illustrated in FIG. 10.

Prior to the analog-to-digital conversion step, the binary-scaled capacitor network is reset. For example, the capacitor network can be reset while the amplification step is being performed. To reset the capacitor network, a clamping switch S16 (FIG. 4) is closed to connect the common upper plate of the capacitors C11 through C18 to the voltage Vcl. The switches S17 associated with the capacitors C11 through C18 also are closed to connect the lower capacitor plates to zero volts. By the time the amplification step is completed, the binary-scaled capacitor network is ready for the analog-to-digital conversion process, at which time the switch S16 is open.

To determine the corresponding digital value of the differential pixel signal, the bottom plate of the largest capacitor C11, corresponding to the most significant bit, is switched to the reference voltage VREF1 by closing the switch S18 associated with that capacitor. The resulting voltage level on the common upper plate of the capacitor network appears on the negative terminal of the comparator 92, and the differential analog pixel signal appears at the positive terminal of the comparator. If the voltage level on the negative terminal of the comparator 92 is greater than the value of the differential pixel signal, then the ADC 74 is returned to its initial value by switching the bottom plate of the capacitor C11 back to zero volts, which corresponds to a digital low bit ("0"). On the other hand, if the voltage level on the negative terminal of the comparator 92 is less than the value of the differential pixel signal, then the bottom plate of the capacitor C11 is kept at the reference voltage VREF1, which corresponds to a digital high bit ("1").

Figure 9:
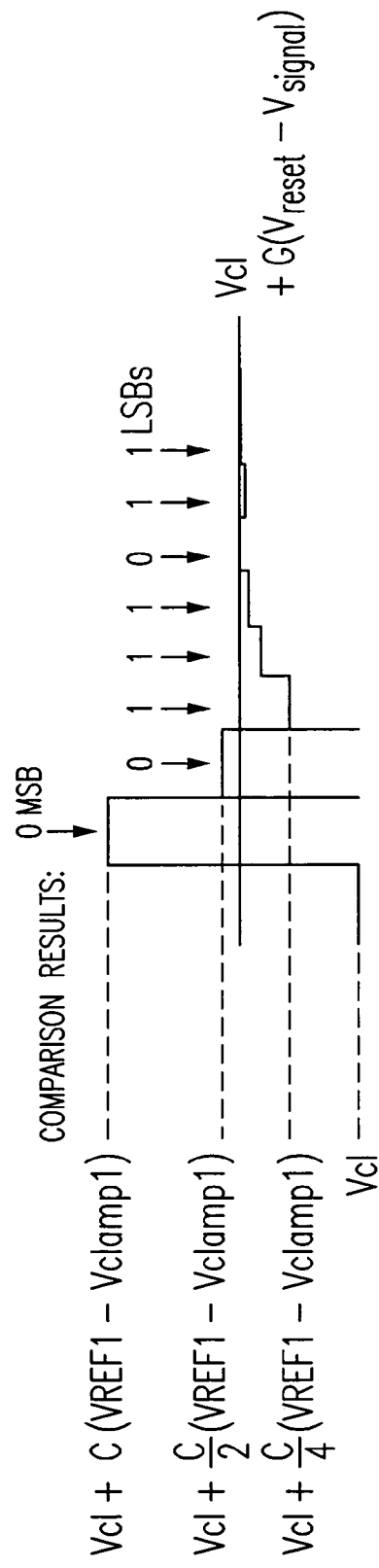
FIG. 9 is a timing diagram illustrating a process of successive approximation performed during analog-to-digital conversion.

The foregoing set of operations is repeated for the remaining capacitors in the binary-scaled network in order of size. The ADC 74, therefore, adjusts the voltage appearing on the negative terminal of the comparator 92 in increments of VREF1/2, VREF1/4, etc, in order to approximate the value of the differential pixel signal. As the algorithm proceeds, the voltage appearing on the negative terminal of the comparator 92 approaches the differential pixel signal until it is equal to it, within the precision of the ADC 74 (see FIG. 9).

The result of the comparison for each capacitor C11 through C18 in the binary-scaled network is stored by the associated one of the latches 96 to hold the switches S17, S18 in their proper positions. Once the foregoing operations are completed for each of the capacitors C11 through C18 in the binary scaled network, the values of the digital bits corresponding to the analog differential pixel signal are stored by the respective latches 96 while the amplification and conversion steps are performed for the pixel 50B from the odd-numbered column 49B.

Figure 11:
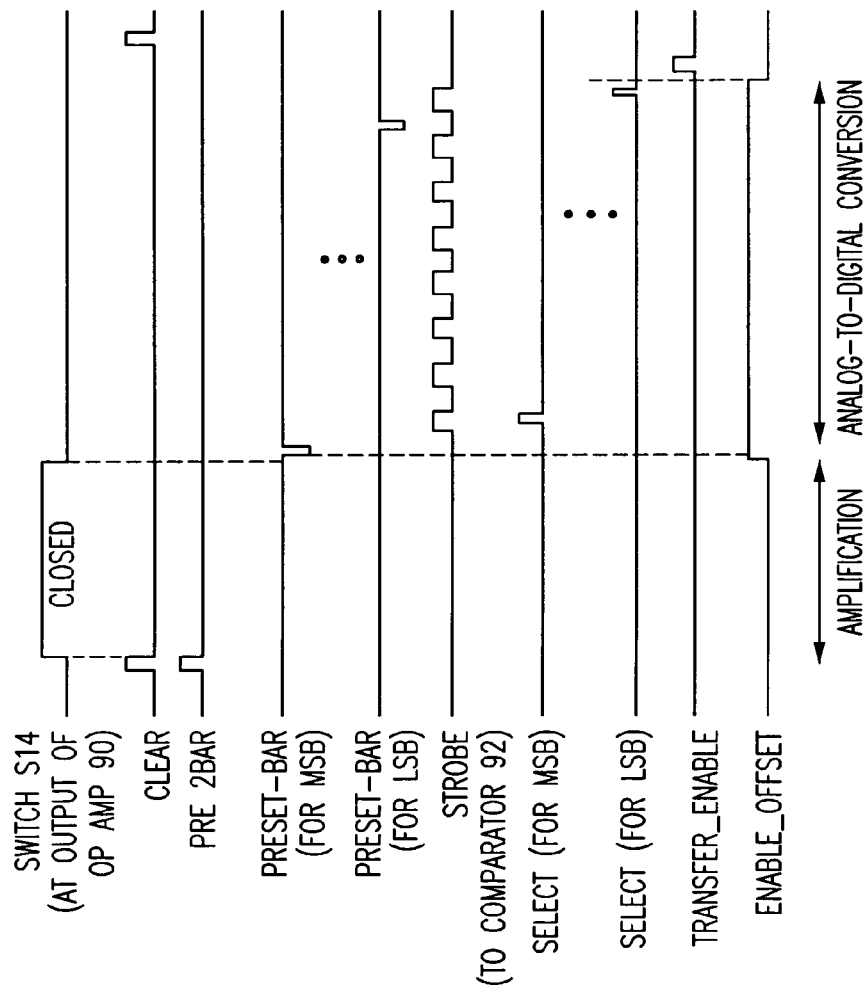
FIG. 11 is a timing diagram associated with the circuit of FIG. 10.

Operation of the circuitry for the logic 94 and latch 96 is described with respect to one of the capacitors in the binary-scaled capacitor network, for example, the capacitor C1, with reference to FIG. 10 and the timing diagram of FIG. 11. The circuit of FIG. 10 includes two latches 96A, 96B each of which has a tri-state driver. Prior to enabling the comparator 92, the circuit of FIG. 10 is cleared by asserting a "clear" signal to turn on the transistor M5. A "preset_bar" signal is asserted which sets a first latch 96A and causes a transistor M7, which corresponds to the switch S18 in FIG. 4 to be turned on. The lower plate of the capacitor C11 is, thus, connected to the voltage level VREF1. Then, the comparator 92 is enabled by asserting the "strobe" signal (see FIG. 8). The output of the comparator 92, is provided to the transistor M6, and a "select" signal enables a transistor M9 to allow the comparator output signal to be locked into the latch 96A. If the output from the comparator 92 is low, then the transistor M7 remains enabled and the lower plate of the capacitor C11 remains connected to the voltage level VREF1. On the other hand, if the comparator output is high, then the transistor M8, corresponding to the switch S17 in FIG. 4, is turned on, thereby connecting the lower plate of the capacitor C11 to ground. The foregoing operations are performed in sequence with respect to each of the capacitors C11 through C18 so as to determine and store a value for each of the eight bits.

Next, the latched values corresponding to the eight bits for the pixel are transferred to the respective second latches 96B while the analog value of the pixel 50B is amplified and converted to its corresponding digital value. The transfer operation is performed in parallel for all eight bits. Prior to transferring the digital bit stored by each latch 96A to the corresponding latch 96B, a "pre2bar" signal is asserted to set the latch 96B. The "pre2bar" signal can be asserted at about the same time as the "clear" signal discussed above. A "transfer_enable" signal is asserted to transfer the value stored by the first latch 96A to the second latch 96B.

Once the bits corresponding to the differential value for the pixel 50A have been transferred to the latches 96B, the operational amplifier 90 can be reset, and the amplification and conversion processes are repeated with respect to the differential signal for the pixel 50B. The eight bits corresponding to the pixel 50B would then be stored in the latches 96A. A "col_select_bar" signal then is provided from the addressing circuit 44 (FIG. 1) to the latches 96 to read out the two bytes of information. In one implementation, the amplification process and the analog-to-digital conversion process take approximately ten microseconds each.

Returning now to FIG. 4, the circuit 52 also includes a calibration network 72 to provide corrections for the analog-to-digital conversion based, for example, on the offset of the comparator 92. The calibration network 72 also includes a network of capacitors C19, C24, C25, C26 whose upper plates are electrically connected to the upper plates of the capacitors C11, C12, C18 in the ADC binary-scaled network. Each capacitor C19, C24, C25 and C26 has a respective latch and logic associated with it. For example, the capacitors C19, C24 have respective latches 102 and logic 100 associated with them and can be connected to either zero volts or a reference voltage VREF2. Similarly, the capacitor C25 has a latch 106 controlled by logic 104 associated with it and can be connected to either zero volts or the reference voltage VREF2. The capacitor C26 has a latch 110 and controlled by logic 108 associated with it and can be connected to either zero volts or a reference voltage VREF3.

The capacitors C19, C24 form a binary-scaled network similar to the network formed by the capacitors C11 through C18, with the capacitor C19 representing a most significant bit (MSB) and the capacitor C24 representing the least significant bit (LSB). Although only two capacitors are shown, the binary-scaled network in the calibration network 72 can include additional capacitors. Thus, in one implementation, the binary-scaled network in the calibration network 72 has five capacitors, such that if the value of the capacitor C19 is C, then the value of the capacitor C24 would be C/16. The set of capacitors C19 through C24 are used to help reduce fixed pattern noise (FPN) as described below.

Calibration can be performed, for example, when power is initially applied to the active sensor pixel chip. In general, the calibration is performed by applying substantially the same voltage to both the positive and negative terminals of the comparator 92, using the binary-scaled capacitor network (C19 through C24) to approximate the value at the output of the comparator, and storing the comparator offset in the calibration network 72. More specifically, the clamping capacitor C10 is charged to the voltage Vcl, and the voltage Vcl is provided to both the positive and negative terminals of the comparator 92 by closing the clamping switches S15 and S16. Initially, the capacitors C19 through C26 in the calibration network 72 are connected to zero volts. The binary-scaled capacitor network (C19 through C24) then can be used to successively approximate the comparator offset in a manner similar to the technique described above with respect to the binary-sealed capacitor network in the ADC 74. The estimated value of the comparator offset is stored by the respective latches 102 and can be applied to the common upper plate of the capacitors in the ADC binary-scaled network just prior to the conversion process using an "enable_offset" signal (see FIG. 11). That has the effect of cancelling the comparator offset in the analog domain before the analog-to-digital conversion begins.

The reference voltage VREF2 used by the binary-scaled network in the calibration network 72 should be separate from the reference voltage VREF1 used by the binary-scaled network in the ADC 74 because the reference voltage for the conversion bits can change depending on the environment. Using separate reference voltages eliminates the need to recalibrate each time the reference voltage for the ADC changes. In addition, using a separate reference voltage enables sub-LSB offset correction of the comparator 92.

Figure 12:
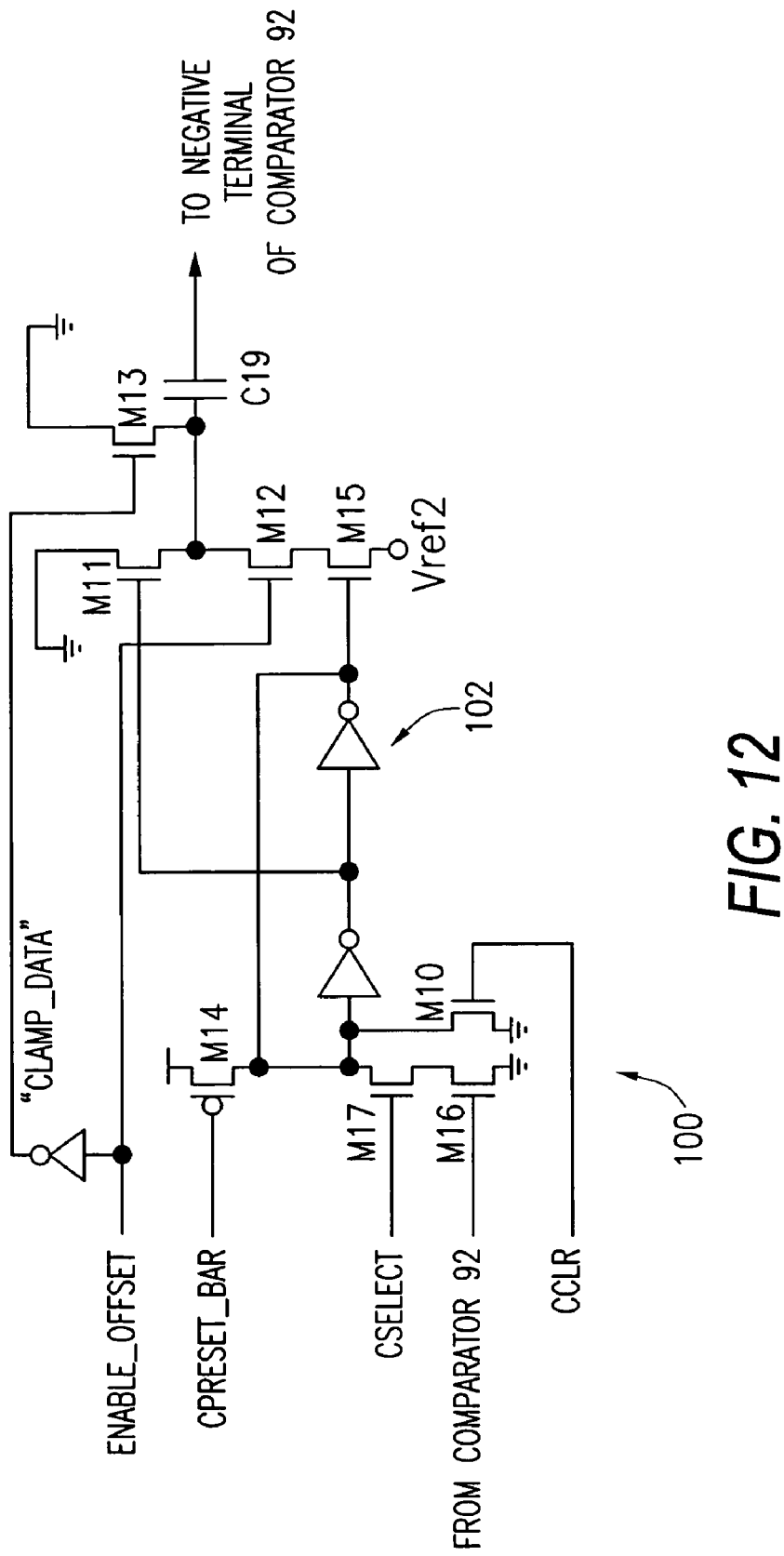
FIG. 12 is an exemplary logic circuit associated with a calibration network for the analog-to-digital conversion.
Figure 13:
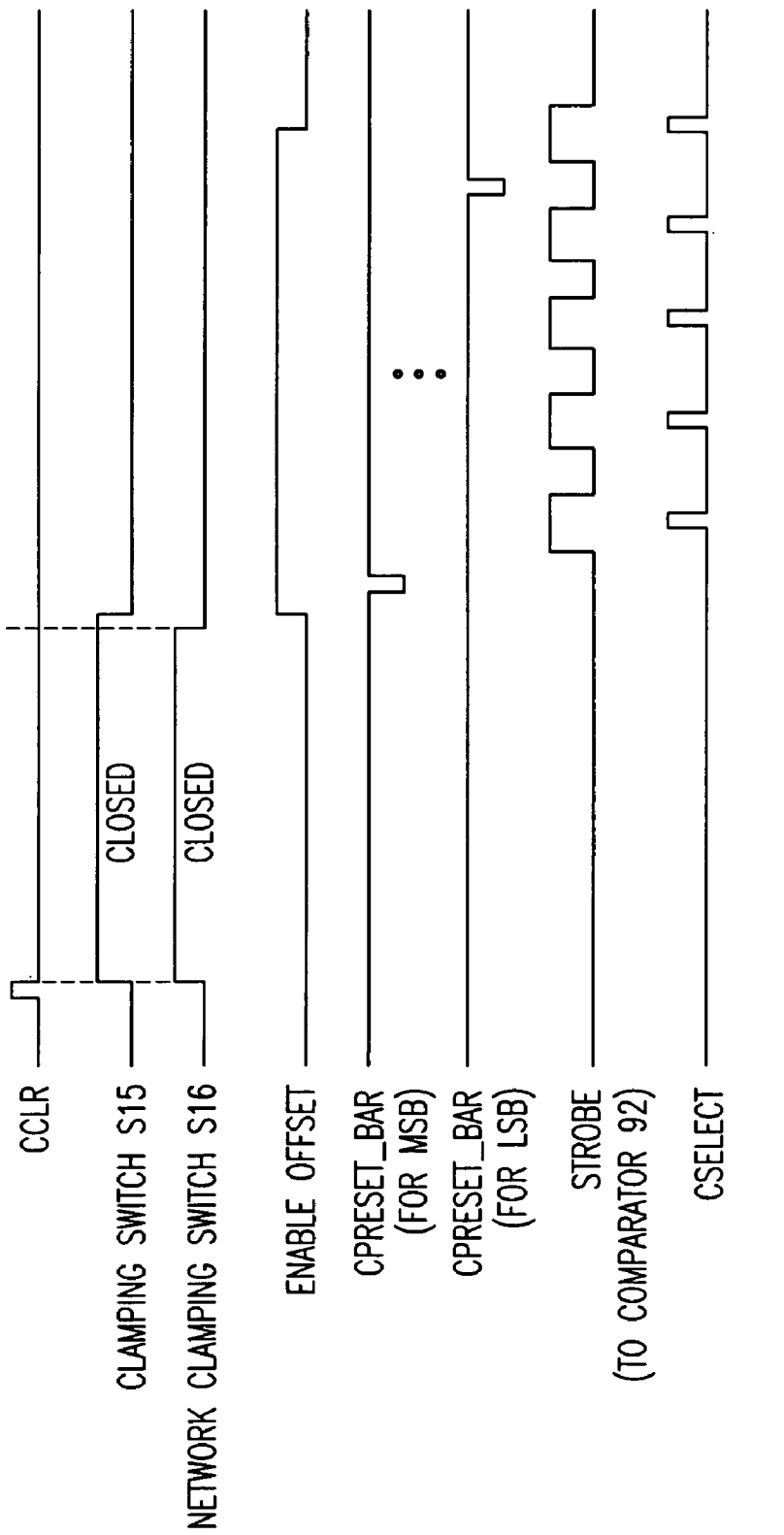
FIG. 13 is a timing diagram associated with the circuit of FIG. 12.

An exemplary circuit for the logic 100 and latch 102 associated with each of the capacitors, C19 through C24, is illustrated in FIG. 12. Operation of the circuitry for the logic 100 and latch 102 is described with respect to one of the capacitors in the binary-scaled capacitor network, for example, the capacitor C19, with reference to FIG. 12 and the timing diagram of FIG. 13. The circuit of FIG. 12 initially is cleared by asserting a "cclr" signal which turns on the transistor M10, thereby connecting the capacitor C19 to ground through the transistor M11. The transistor M11 corresponds to the switch S19 in FIG. 4.

Once the capacitor C10 at the positive terminal of the comparator 92 is charged to the voltage Vcl, the "enable_offset" signal is asserted, thereby turning on the transistors M12, M13. Next, a signal "cpreset_bar" is asserted which turns on a transistor M14. That, in turn, causes the transistor M11 to be turned off, and the transistor M15, which correspond to the switch S20 in FIG. 4, to be turned on. The lower plate of the capacitor C19 is, thus, connected to the voltage VREF2.

Next, the comparator 92 is enabled by asserting the "strobe" signal (see FIG. 8). The output of the comparator 92 is provided to the transistor M16, and a "cselect" signal enables a transistor M17 to allow the comparator output signal to be locked into the latch 102. If the output from the comparator 92 is low, then the transistor M16 is disabled. The transistor M11 remains turned off, and the transistor M15 remains turned on so that the lower plate of the capacitor C19 remains connected to VREF2. On the other hand, if the comparator output is high, then the transistor M15 is turned off and the transistor M11 is turned on, thereby connecting the lower plate of the capacitor C19 to ground. The foregoing operations are performed in sequence with respect to each of the capacitors C19 through C24 so as to determine and store the offset value of the comparator 92 in the calibration network 72.

As previously noted, the comparator offset stored by the calibration network 72 can be applied to the common upper plate of the capacitors in the ADC binary-scaled network just prior to the conversion process by asserting the "enable_offset" signal (see FIG. 11) to cancel the comparator offset.

In the implementation of FIG. 4, the analog-to-digital architecture does not determine a sign bit for the comparator offset. Thus, one of the additional capacitors (C25) in the calibration network 72 can be used during the calibration process to add a DC shift to ensure that the comparator offset appears as a positive voltage and is within the range that is established by the voltage level VREF2. The value of the capacitor C25 should be at least as large as the largest capacitor in the binary-scaled correction network (C19 through C24). In other words, the value of the capacitor C25 should be at least as large as the value of the capacitor C19.

The capacitor C26 in the calibration network 72 can be used to add a post-gain offset voltage to the differential pixel value to increase the dynamic range of the ADC 74. The post-gain offset can help eliminate, for example, the clipping of very small signals due to systematic ADC offsets. The value of the capacitor C26 can be the same as the capacitor C19.

Figures 14, 14A:
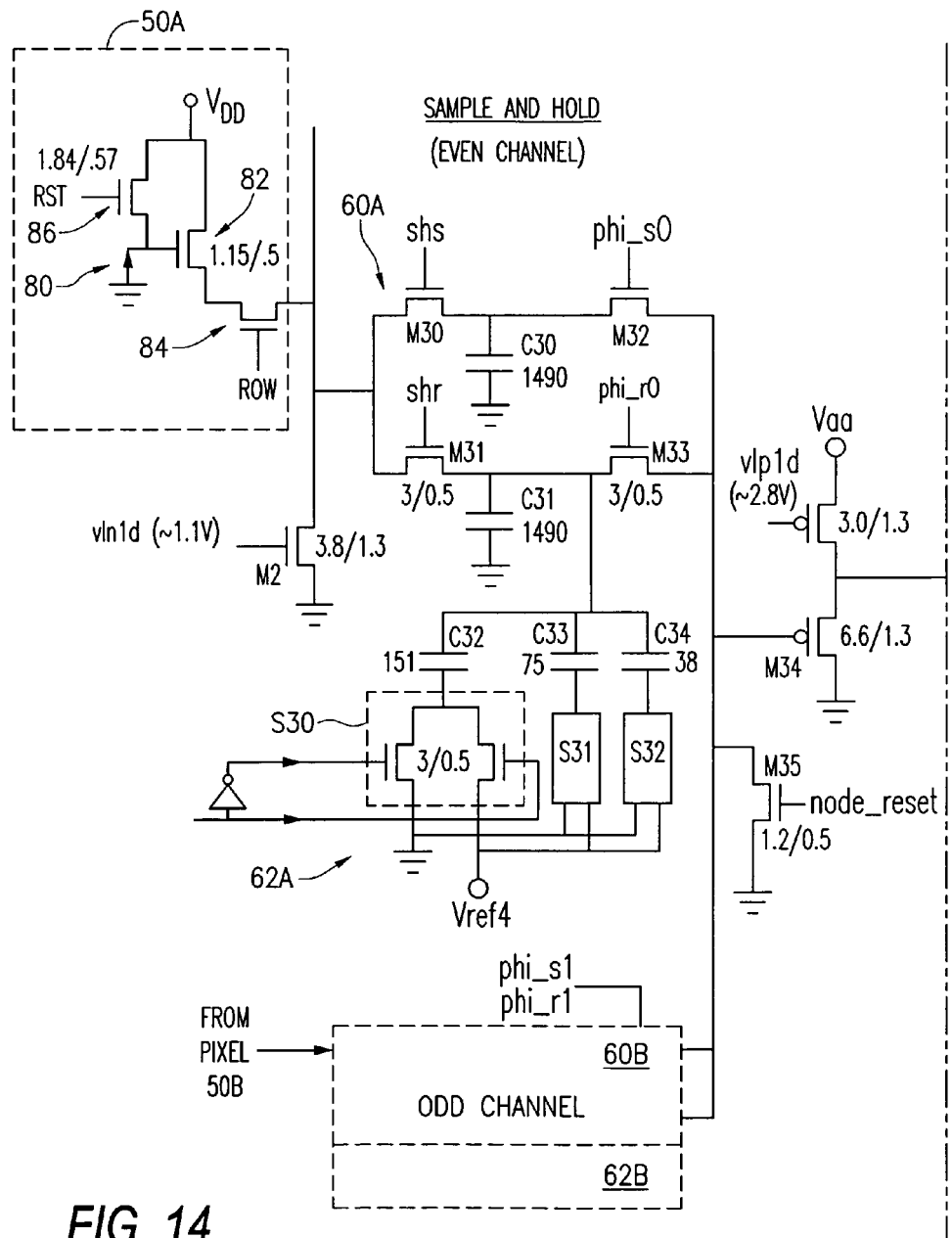
FIG. 14, which comprises FIGS. 14A and 14B, form an illustration of another embodiment of the readout circuit.
Figures 14, 14B:
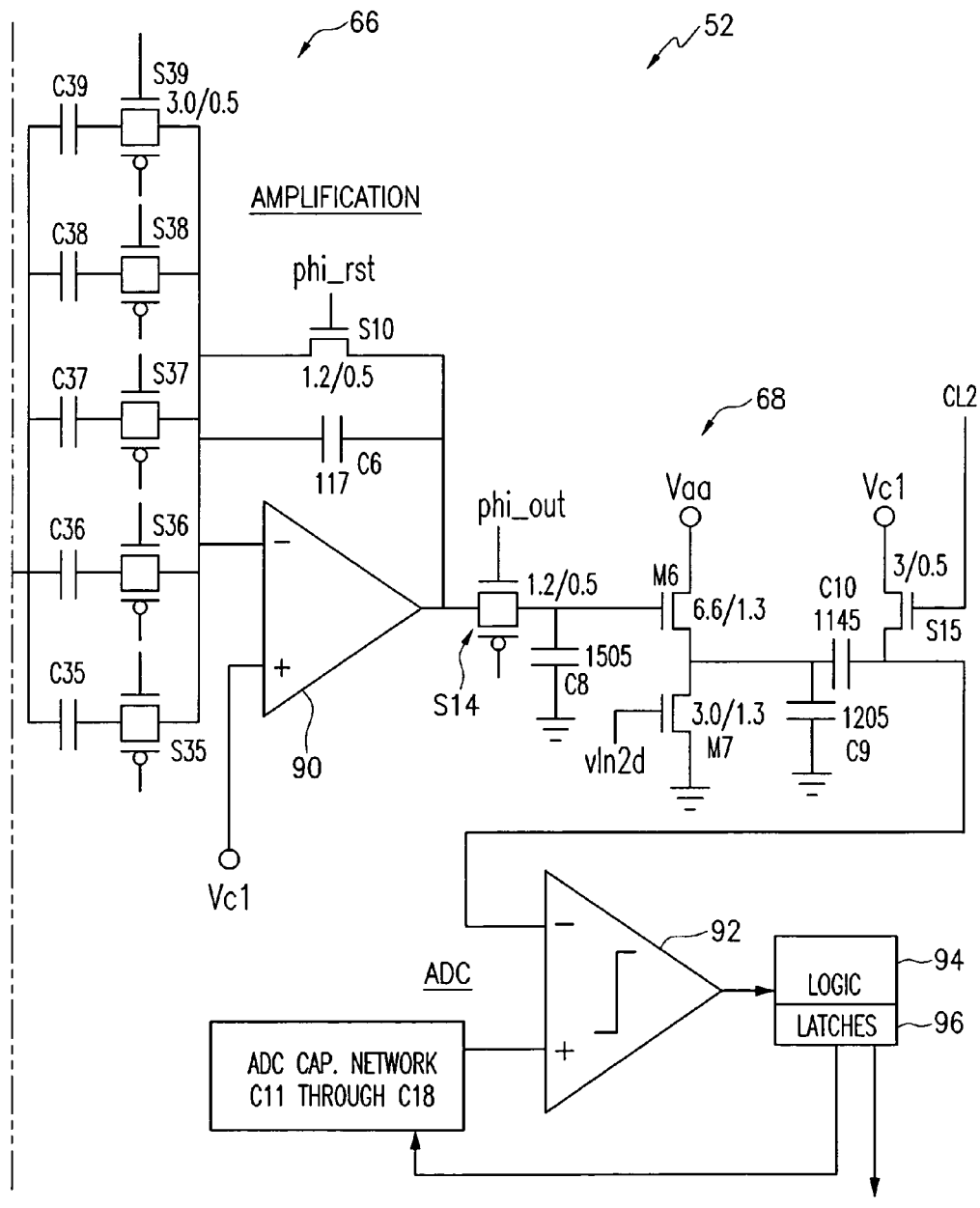

FIG. 14 illustrates an alternative embodiment of the readout circuit 52. Components that are the substantially the same as in the embodiment of FIG. 4 are identified by the same reference numbers or letters. The circuit 52 of FIG. 14 differs primarily with respect to the configuration of the sample-and-hold circuits 60A, 60B, the circuits 62A, 62B that provides the pre-gain offset, and the amplification circuit 66. As in the implementation of FIG. 4, the circuit 52 samples values from pixels in two columns in parallel and then processes them sequentially.

In FIG. 14, each sample-and-hold circuit, such as the sample-and-hold circuit 60A, includes a first switch, implemented as transistor M30, and a capacitor C30. A signal (SHS) is applied to the gate of the transistor M30 to control whether the transistor is in a conductive or non-conductive state. The sample-and-hold circuit also includes a second switch, implemented as transistor M31, and a capacitor C31. A signal (SHR) is applied to the gate of the transistor M31 to control the state of the transistor. This arrangement allows both the pixel signal and reset values to be sampled and stored. Thus, correlated double sampling (CDS) can be performed to reduce reset noise associated with the pixel as well as noise associated with the source-follower transistor 82. Signals stored by the capacitors C30, C31 can be provided to a source-follower transistor M34 by enabling a respective one of the switches M32, M33. A signal "phi_s0" controls the state of the switch M32, whereas a signal "phi_r0" controls the state of the switch M33.

The operation of the sample-and-hold circuit 60A in FIG. 14 is explained with reference to the timing diagram of FIG. 15. A sampled pixel value is switched through the sampling transistor M30 to one side of the capacitor C30 by asserting the signal "shs." Next, the pixel 50A is reset by asserting the signal "RST" and the reset value is switched through the sampling transistor M31 to one side of the capacitor C31 by asserting the signal "shr".

A variable pre-gain offset can be provided to the sampled reset value using the circuitry 62A which includes multiple capacitors C32, C33, C34 connected in parallel each of which can be connected either to ground or to the reference voltage (VREF4) using respective switches S30, S31, S32.

The sample-and-hold circuit 60B and the associated circuitry 60B for establishing a pre-gain offset with respect to the odd column can be identical to the corresponding circuit for the even column. Once the signal and reset values for the pixels 50A, 50B have been sampled and stored, the amplification and analog-to-digital conversion steps are performed for the even-column pixel 50A and subsequently for the odd-column pixel 50B.

The amplification stage 66 of the circuit in FIG. 14 includes the operational amplifier 90, the reset switch S10 which is controlled by a signal "phi_rst," and the feedback capacitor C6. The amplification circuit 66 also includes a binary-scaled array of capacitors C35 through C39 which allows a variable gain to be selected. The left-hand plate of each capacitor C35 through C39 is connected to a common node at the output of the source-follower transistor M34. The right-hand plate of each of—the capacitors C35 through C39 can be connected to the negative terminal of the operational amplifier by closing respective switches S35 through S39.

In contrast to the configuration of FIG. 4, the circuitry for correcting the offset of the operational amplifier 90 can be eliminated in FIG. 14, and the positive terminal of the operational amplifier can be connected directly to the voltage Vcl. Similarly, in the implementation of FIG. 14, only a single capacitor array for establishing the variable gain is needed, in contrast to the two capacitor arrays (C3, C4, C5) used in the implementation of FIG. 4.

Figure 16:
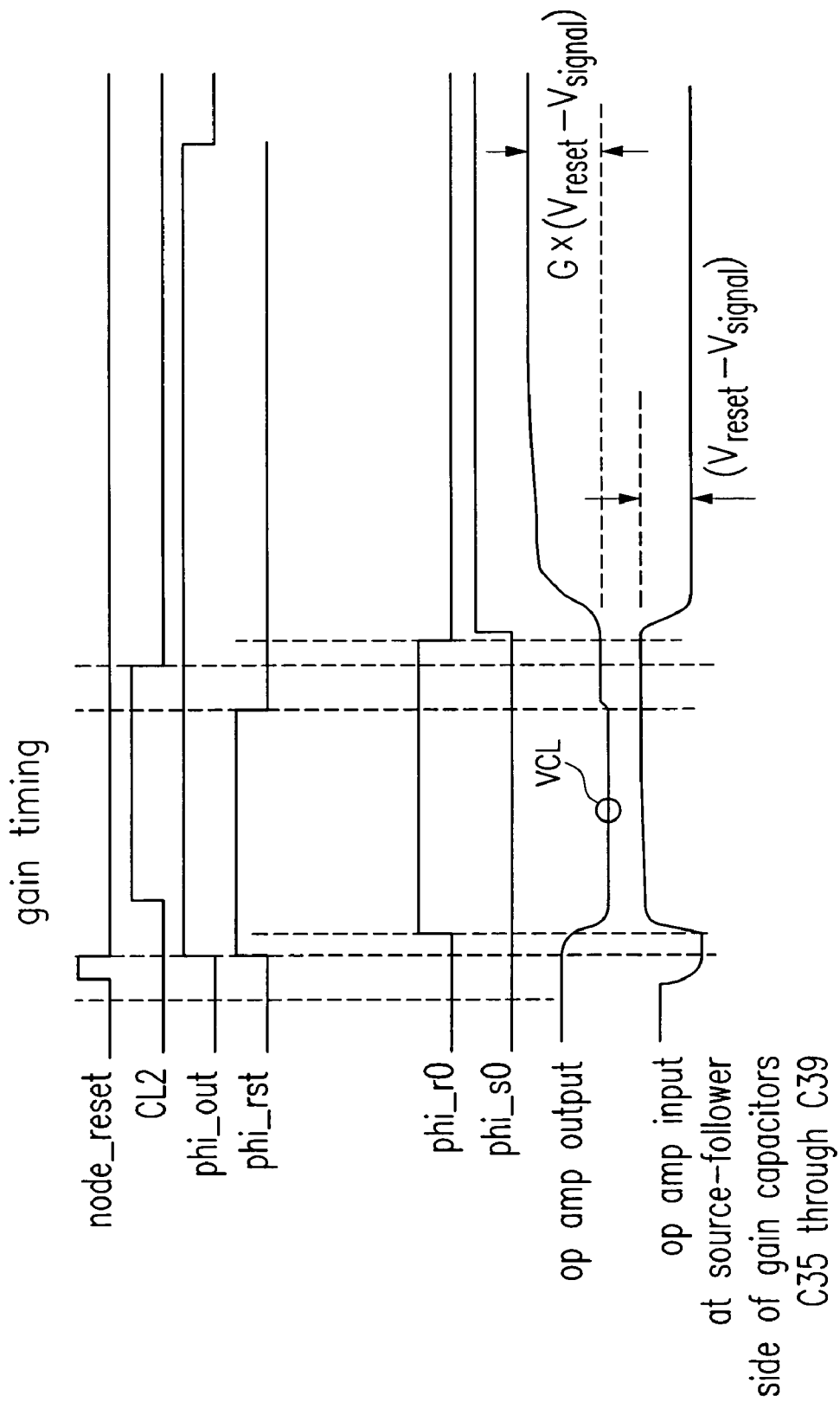

The operation of the amplification stage of the circuit of FIG. 14 is explained with reference to the timing diagram of FIG. 16. A "node_reset" signal on the gate of a transistor M35 is asserted to clear any residual charge remaining on the common line at the input to the source-follower M34. The operational amplifier 90 is reset by asserting the signal "phi_rst" to close the reset switch S10. At substantially the same time, the variable gain is selected by closing one or more of the switches S35 through S39, and a signal "phi_out" is asserted to close the switch S14 at the output of the operational amplifier 90.

The pixel reset value stored, for example, by the capacitor C31 in the sample-and-hold circuit 60A is driven to the left-hand plates of the capacitors C35 through C39 by asserting a signal "phi_ro" which closes the switch M33. The right-hand plate of the clamping capacitor C10 at the output stage of the operational amplifier 90 is charged to the voltage Vcl by asserting the signal "CL2" to close the switch S15. The reset switch S10 for the operational amplifier 90 then is turned off, and once the output of the operational amplifier 90 settles to the voltage Vcl, the switch S15 also is turned off.

Next, the switch M33 is turned off. The switch M32 then can be turned on by asserting a signal "phi_so" to drive the pixel signal level stored by the capacitor C30 to the array of capacitors C35 through C39. The charge is transferred to the feedback capacitor C6, which causes the output of the operational amplifier 90 to increase by the gain (G) times the differential value between the pixel reset and signal values. The amplified differential value also appears at the clamping capacitor C10.

Once the amplification step is complete, the amplified differential value can be converted to a corresponding digital value in the manner described above with respect to FIG. 4. The entire process can be repeated with respect to the reset and signal values corresponding to the pixel 50B from the odd column and previously stored by the sample-and-hold circuit 60B. As previously described, the two bytes of information corresponding to the pixels 50A, 50B can be transferred to the bus 54, with one byte transferred during each clock cycle.

The foregoing implementations have been explained assuming that the pixels 50A, 50B operate in a photodiode mode in which the pixel signal value is sampled prior to the pixel reset value. However, in other implementations, the pixels can operate in a photogate mode in which the reset value is sampled prior to the signal value.

Additionally, the foregoing implementations have been described with respect to a column parallel architecture in which each readout circuit 52 processes signals from two columns. However, as previously mentioned, the readout circuits 52 can be modified so that each readout circuit is associated with only a single column of sensors, In that case, each readout circuit would need only one of the sample-and-hold circuits 60A, 60B. Similarly, each latch circuit 96 could be simplified because it would need to store just a single bit for the particular pixel signal being processed.

In other implementations, a single amplification stage and analog-to-digital conversion stage can be associated with a group of columns (e.g, four or six) in the array. In such a situation, the readout circuit would include multiple sample-and-hold circuits according to the number of columns with which the amplification and analog-to-digital stages are associated.

The inventor recognized that sharing an A to D converter between multiple logical units can produce a special issue. A typical way that this is done is to associate an A to D converter with multiple logical units, preferably which are lines of the array, e.g., columns. It is often desired to read out the pixel information in the same order as its placement in the row. An A to D converter takes a certain amount of time, the "settling time", to effect a conversion. If the A to D converter is associated with two adjacent columns, then there is very little time between the first column readout and the second column read out.

The present system allows reading every 1/n th pixel, then returning to read others. The time between the first reading and the second reading can become the settling time for the A to D converter. Certain items are stored locally in the A to D converter.

If the A to D converter is being shared between n columns, then the data unit, herein assumed to be a byte, is stored after each one of the conversions is carried out. N or n-1, therefore, storage units are used for each A to D converter.

Figure 17:
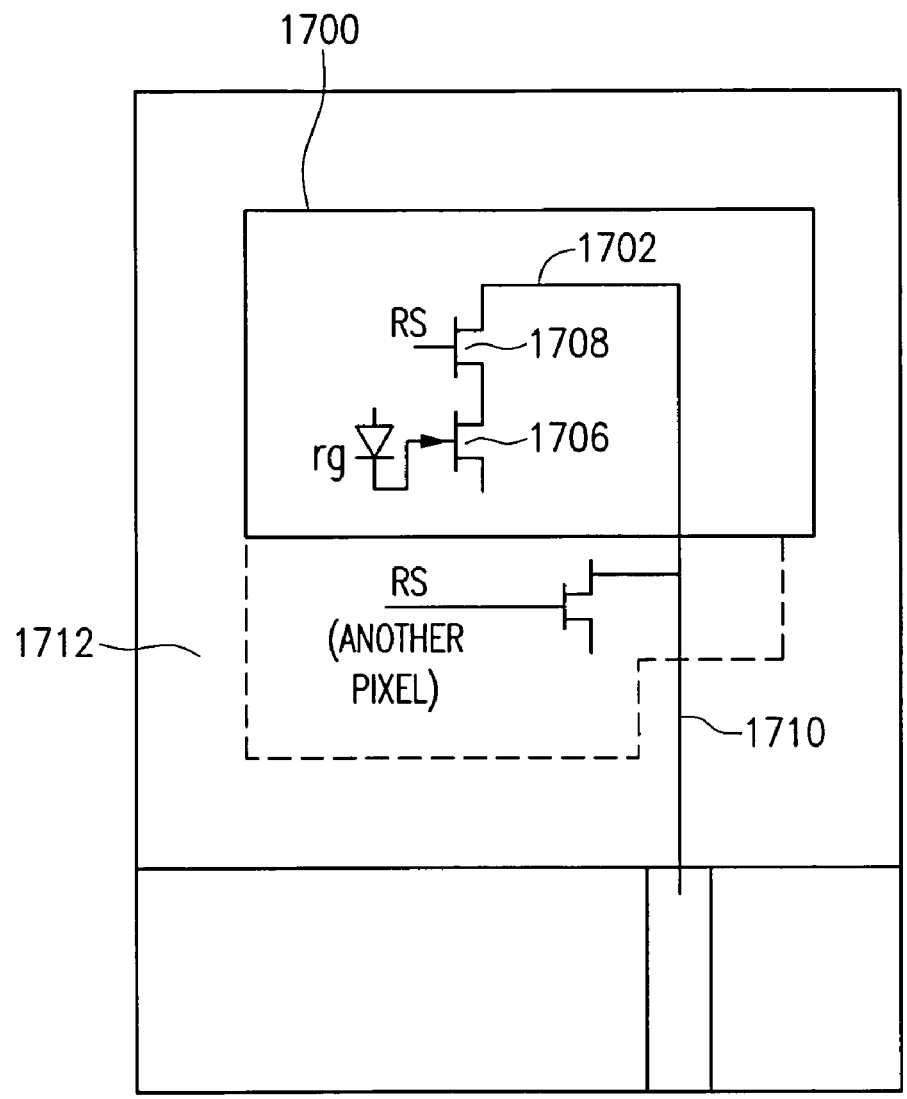
FIG. 17 shows a basic active pixel sensor layout.

FIG. 17 shows the basic layout of the active pixel sensor system. A plurality of pixels 1700 are arranged in an array. Each pixel has the layout generally shown for pixel 1702. A photoreceptor, here shown as a photodiode, produces an electrical output indicative of received light. The charge is connected to an in-pixel buffer 1706 and is coupled through a row select element 1708. Multiple rows are coupled using line 1710 to the A to D converter section 1712. The multiple rows are connected together in parallel. One of the rows can be turned on at any time by enabling the in-pixel row select element 1708.

Figure 18:
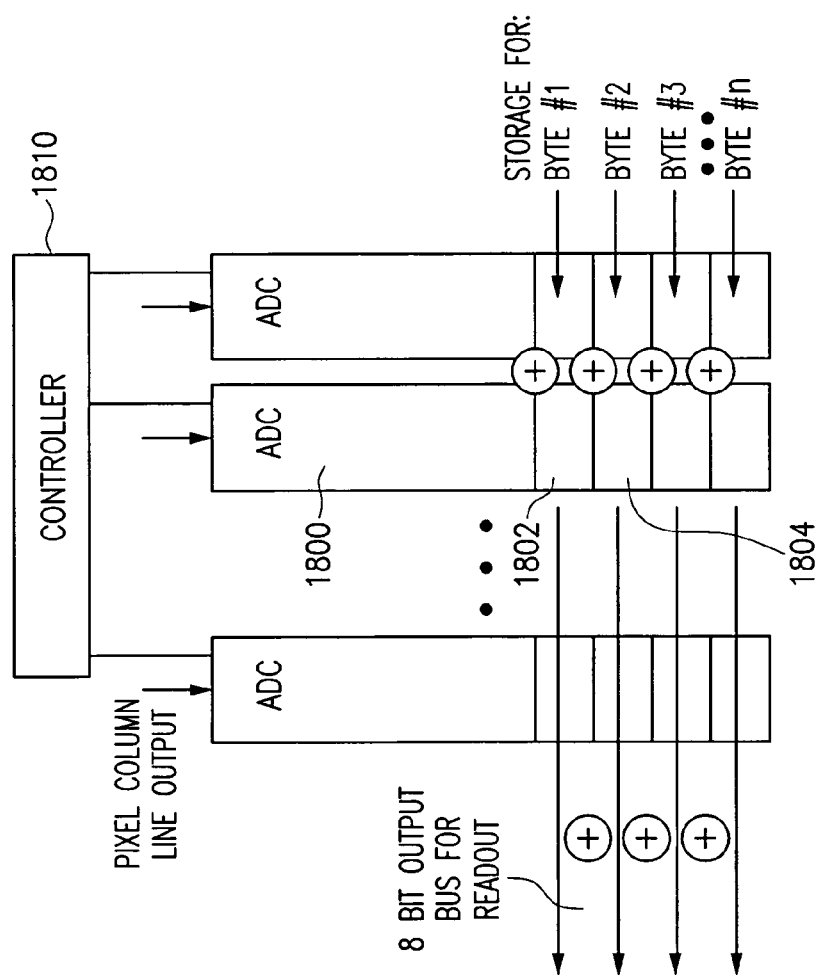
FIG. 18 shows a multiple byte storage inside the A to D converter.

Each A to D converter preferably has the layout shown in FIG. 18. The system shown in FIG. 18 assumes that each A to D converter is associated with two rows of pixels and that each pixel is A to D converted as a byte of data. The A to D converters are associated with two adjacent columns. This allows later readout to obtain the results in the same order as their layout without waiting for the ADCs to settle. Hence, two bytes are stored as each A to D converter multiplexes between two columns.

When the column is A to D converted by A to D converter 1800, the output is stored in position 1802. Position 1802 is a one byte storage unit, which assumes that one byte is used for each pixel sampling. Of course, different size storage units can be used for different pixel lengths.

The system in FIG. 18 shows n bytes of storage. Each storage unit is connected to the readout bus. In the system shown in FIG. 18, four storage units are shown connected to a four byte bus. An alternative, of course, uses a single byte bus which multiplexes between the different storage units. The byte is stored locally, enabling the results of the A to D converter to be readout in the usual linear way. Otherwise, it could be necessary to sample bytes 1, 3, 5, etc., and then 2, 4, 6, etc. Faster data readout can be obtained by using a parallel data output bus that is n by 8 bits wide when n bytes of storage are used. This can also be used for local arithmetic processing of neighboring columns, e.g. for pixel binning. Also if, more that one row of data is stored locally, this enables significant advantages.

The controller 1810, e.g. a processor, controls the readout of the of information from the photosensor elements and the analog-to-digital converters. The controller controls each analog to digital converter to each convert information from a first line of the array, to store said information from the first line of the array in one of the unit storage elements 1802. Then it controls to read out a second line of the array, and store the information from the second line of the array in the other of said unit storage elements 1804. Then, all the information from all of the unit storage elements is read out in a desired order, e.g., line sequentially.

Although only a few embodiments have been described in detail above, other embodiments are contemplated by the inventor and are intended to be encompassed within the following claims. In addition, other modifications are contemplated and are also intended to be covered.

As described above, the A to D converters are preferably used for more than one logical unit, e.g., column. Of course, this system is still applicable when the A to D converters are used with one column or a single A to D converter with the entire unit. An advantage of this system is that any desired output form can be formed. For example, multiple byte outputs can be formed in this way without increasing the load on the A to D converter. This system can also be used to change the way that the data is usually processed.

The logical units could alternately be rows, or could be other units of multiple pixels.

All such modifications, and all modifications that would be considered predictable to one of ordinary skill in the art, are intended to be encompassed within the scope of the following claims.

What is claimed is:

1. An active pixel sensor device, comprising:
an array of pixels, arranged in logical units, wherein each pixel comprises a photosensor element, an in-pixel buffer element, and an in-pixel selector element;
a plurality of analog-to-digital converters, formed on the same substrate as said pixel sensor array, and each associated with N logical units of the pixel sensor array, each of said N logical units having including a plurality of pixels, each of said plurality of analog-to-digital converters comprising:
a plurality of storage elements; and
an analog-to-digital (ADC) portion, said ADC portion for receiving an analog signal from one of said pixel sensors of an associated logical unit when a selector element associated with said one pixel is enabled, and for converting said analog signal to a converted digital value, said ADC portion storing said converted value into one of said plurality of storage elements; and a readout controller for controlling readout of information from the photosensor elements by controlling each of said analog-to-digital converters to:
convert first information from a first line of the array and store said first information in one of said plurality of storage elements;
after said convert and store of said first information, convert second information from a second line of the array and store said second information in another one of said plurality of storage elements; and
read out said first and second information from said plurality of storage elements in a desired order;
wherein N is at least two.

2. A sensor as in claim 1, wherein said logical units are lines of the array including either columns of the array or rows of the array.

3. A device as in claim 2, wherein said analog-to-digital converters are associated with at least two adjacent lines of the array.

4. A method of operating a pixel sensor array, comprising:
obtaining a pixel sensor array of photosensitive elements, each having a photosensitive element in a pixel, a buffer in said pixel associated with said photosensitive element, and a selector transistor in said pixel which is enabled to allow a signal from said pixel to pass, and disabled to block the signal from passing;
connecting a plurality of said outputs of said selector transistors to one another, to form a plurality of logical units, each logical unit formed by a plurality of said output transistors which are connected to one another;
receiving, in each of a plurality of A/D converter units each comprising a plurality of first storage unit, a plurality of second storage units, and an analog-to-digital conversion (ADC) portion, a respective plurality of signals from a respective plurality of first logical units, and A/D converting said respective plurality of signals into a respective plurality of converted digital values and storing said respective plurality of converted digital values information in a respective one of said plurality of first storage units;
receiving, in said plurality of A/D converter units, a respective of signals from a respective plurality of second logical units, adjacent to said first logical units, and A/D converting said respective plurality of signals into a respective plurality of converted digital values and storing said respective plurality of converted digital values in a respective one of said plurality of second storage units; and
reading out said information from said A/D conversion unit in a different order than an order in which the information was converted.

5. A method as in claim 4, wherein said different order is in a serial order.

6. A method as in claim 4, wherein said units are linear units which are one of rows and columns, and said different order include a first different order which skips lines between conversions, and a second different order which is a complete order.

7. The device of claim 1, wherein each pixel is a CMOS pixel.

* * * * *